(12) United States Patent
Nandi et al.

(10) Patent No.: US 9,350,327 B2
(45) Date of Patent: May 24, 2016

(54) FLIP-FLOPS WITH LOW CLOCK POWER

(71) Applicant: Texas Instruments Incorporated, Dallas, TX (US)

(72) Inventors: Suvam Nandi, Bangalore (IN); Badarish Mohan Subbannavar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/498,412

(22) Filed: Sep. 26, 2014

(65) Prior Publication Data

US 2016/0094204 A1    Mar. 31, 2016

(51) Int. Cl.
*H03K 3/012* (2006.01)
*H03K 3/037* (2006.01)

(52) U.S. Cl.
CPC .............. *H03K 3/012* (2013.01); *H03K 3/0372* (2013.01)

(58) Field of Classification Search
CPC ..... H03K 5/131; H03K 5/133; H03K 3/0375; H03K 3/0372; H03K 19/173; H03K 19/177; H03K 19/20
USPC .......................................... 327/199, 202, 203
See application file for complete search history.

(56) References Cited

U.S. PATENT DOCUMENTS

| | | | |
|---|---|---|---|
| 7,391,250 B1 * | 6/2008 | Chuang | H03K 3/0375 326/104 |
| 2008/0297219 A1 * | 12/2008 | Manohar | H03K 3/011 327/202 |

\* cited by examiner

*Primary Examiner* — John Poos
(74) *Attorney, Agent, or Firm* — John R. Pessetto; Frank D. Cimino (57) ABSTRACT

The disclosure provides a flip-flop that utilizes low power as a result of reduced transistor count. The flip-flop includes a tri-state inverter that receives a flip-flop input and a clock input. A master latch is coupled to an output of the tri-state inverter and provides a control signal to the tri-state inverter. The control signal activates the tri-state inverter. A slave latch receives an output of the master latch and the control signal. An output inverter is coupled to an output of the slave latch and generates a flip-flop output.

29 Claims, 7 Drawing Sheets

FLIP-FLOPS WITH LOW CLOCK POWER

TECHNICAL FIELD

Embodiments of the disclosure relate to flip-flops with low clock power in an integrated circuit.

BACKGROUND

As a result of the continuous developments in integrated circuits (ICs), the flip-flops contribute to a substantial portion of any circuit design's power. The various units of an IC that consume power are logic implementation, flip flops, RAM, clock tree and integrated clock gating (ICG) cells. The comparison of the power consumption by the various units is as follows; logic implementation 29%, flip-flops 27%, RAM 18%, clock tree 16% and the ICG consumes 10% of the total power in a typical design. In digital designs, the flip-flops form 20-40% of the digital sub-chips.

The majority of power inside a flip-flop is consumed by the transistors receiving a clock input, since the data activity factors are typically much lower. Irrespective of whether the data changes every cycle or not, the transistors receiving the clock input keep switching at every clock cycle. Thus, it is apparent that with reduced transistor count, the power consumed by the flip-flop can also be reduced. Further, clock power in flip-flops is critical to overall digital power consumption. The clock power consumption is due to tedious synchronization of the various clock phases and routing of these clock signals within flip-flops. It is apparent that a reduction in area of flip-flops will directly improve overall digital power consumption.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a flip-flop. The flip-flop includes a tri-state inverter that receives a flip-flop input and a clock input. A master latch is coupled to an output of the tri-state inverter and provides a control signal to the tri-state inverter. The control signal activates the tri-state inverter. A slave latch receives an output of the master latch and the control signal. An output inverter is coupled to an output of the slave latch and generates a flip-flop output.

Other aspects and example embodiments are provided in the Drawings and the Detailed Description that follows.

DETAILED DESCRIPTION OF THE EMBODIMENTS

Figure 1:
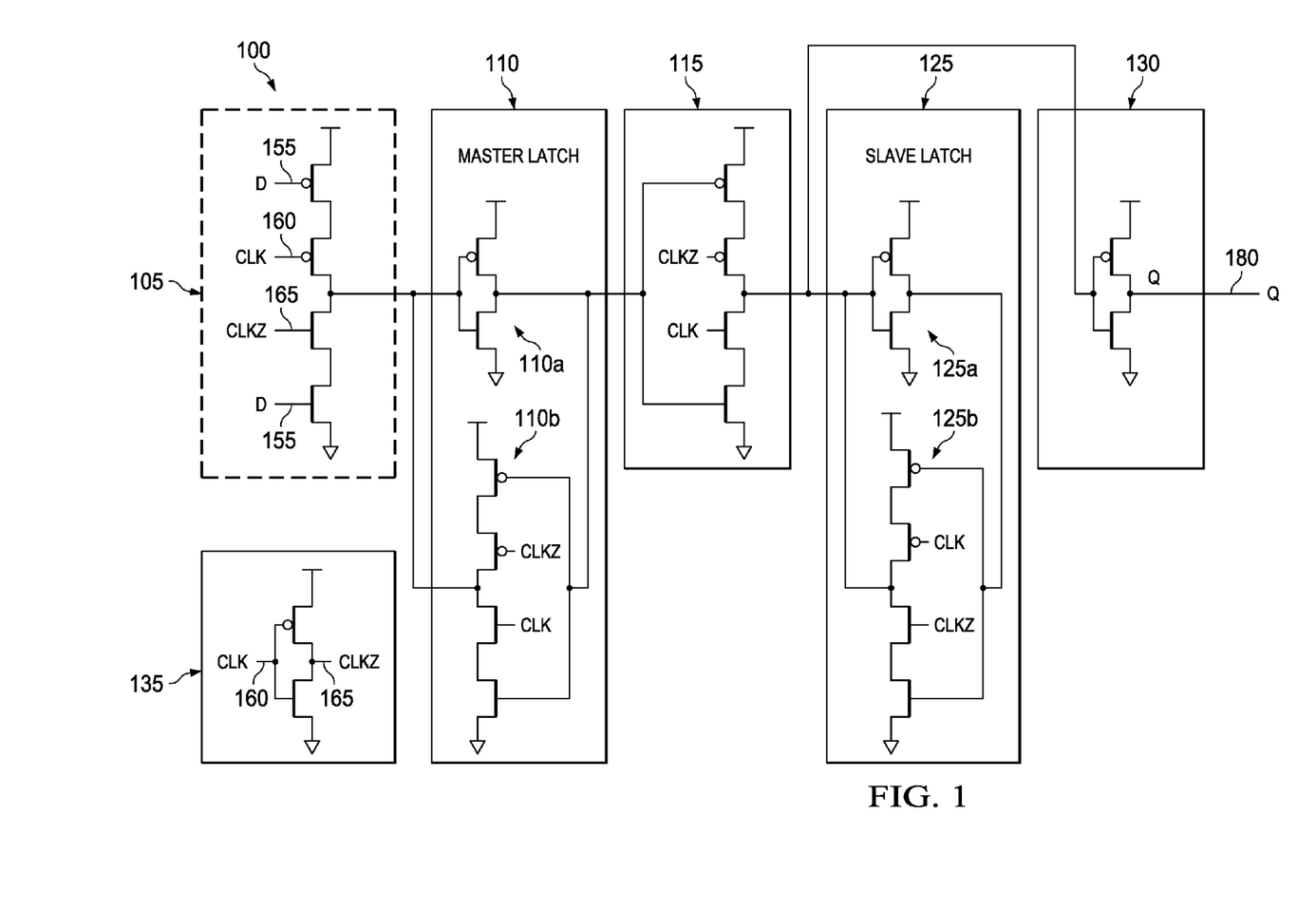
FIG. 1 illustrates a schematic of a flip-flop.

FIG. 1 illustrates a schematic of a flip-flop 100. The flip-flop 100 receives a flip-flop input D 155, a clock input CLK 160 and an inverted clock input CLKZ 165. A tri-state inverter 105 is coupled to a master latch 110. The output of the master latch 110 is received at a tri-state inverter 115. A slave latch 125 is coupled to the tri-state inverter 115. The master latch 110 and the slave latch 125 are implemented using two back-to-back inverters.

The back-to-back inverters include an inverter 110a and a tri-state inverter 110b in the master latch 110 and an inverter 125a and a tri-state inverter 125b in the slave latch 125. An output of the slave latch 125 is equal to an output of tri-state inverter 115. The output of the slave latch 125 is received at a data inverter 130. The data inverter 130 generates a flip-flop output Q 180. An inverter 135 receives the clock input CLK 160 to generate the inverted clock input CLKZ 165.

The operation of the flip-flop illustrated in FIG. 1 is explained now. The flip-flop 100 is implemented using PMOS and NMOS transistors. The flip-flop input 155 is stored using the master latch 110 coupled to the tri-state inverter 115 and the slave latch 125. The output of the slave latch 125 is inverted by the data inverter 130 to generate the flip-flop output Q 180. The majority of power inside the flip-flop 100 is consumed by the transistors receiving the clock input CLK 160 and the inverted clock input CLKZ 165. Irrespective of whether there is a change in the flip-flop input 155, the transistors receiving the clock input CLK 160 and the inverted clock input CLKZ 165 switch at every clock cycle.

In the flip-flop 100, the clock input CLK 160 and the inverted clock input CLKZ 165 are received at an input end of the flip-flop 100, the tri-state inverter 110b of the master latch 110, the tri-state inverter 115 and the tri-state inverter 125b of the slave latch 125. Therefore, there are a total of 10 transistors that receive either the clock input CLK 160 or the inverted clock input CLKZ 165. Thus it is apparent that with reduced number of transistors especially clock transistors, the power consumed by the flip-flop 100 can also be reduced. Further, the constant toggling of the clock input CLK 160 and the inverted clock input CLKZ 165 causes a significant amount of gate capacitances to be charged and discharged.

With the reduction in the number transistors, a considerable amount of power consumed by the flip-flop 100 can be reduced. In addition, the clock power in flip-flop 100 is critical to overall digital power consumption. The clock power consumption is due to tedious synchronization of the various clock phases and routing of these clock signals within the flip-flop 100. Hence, the flip-flop 100 must be aligned with respect to the clock input CLK 160, resulting in a power efficient design.

Figure 2:
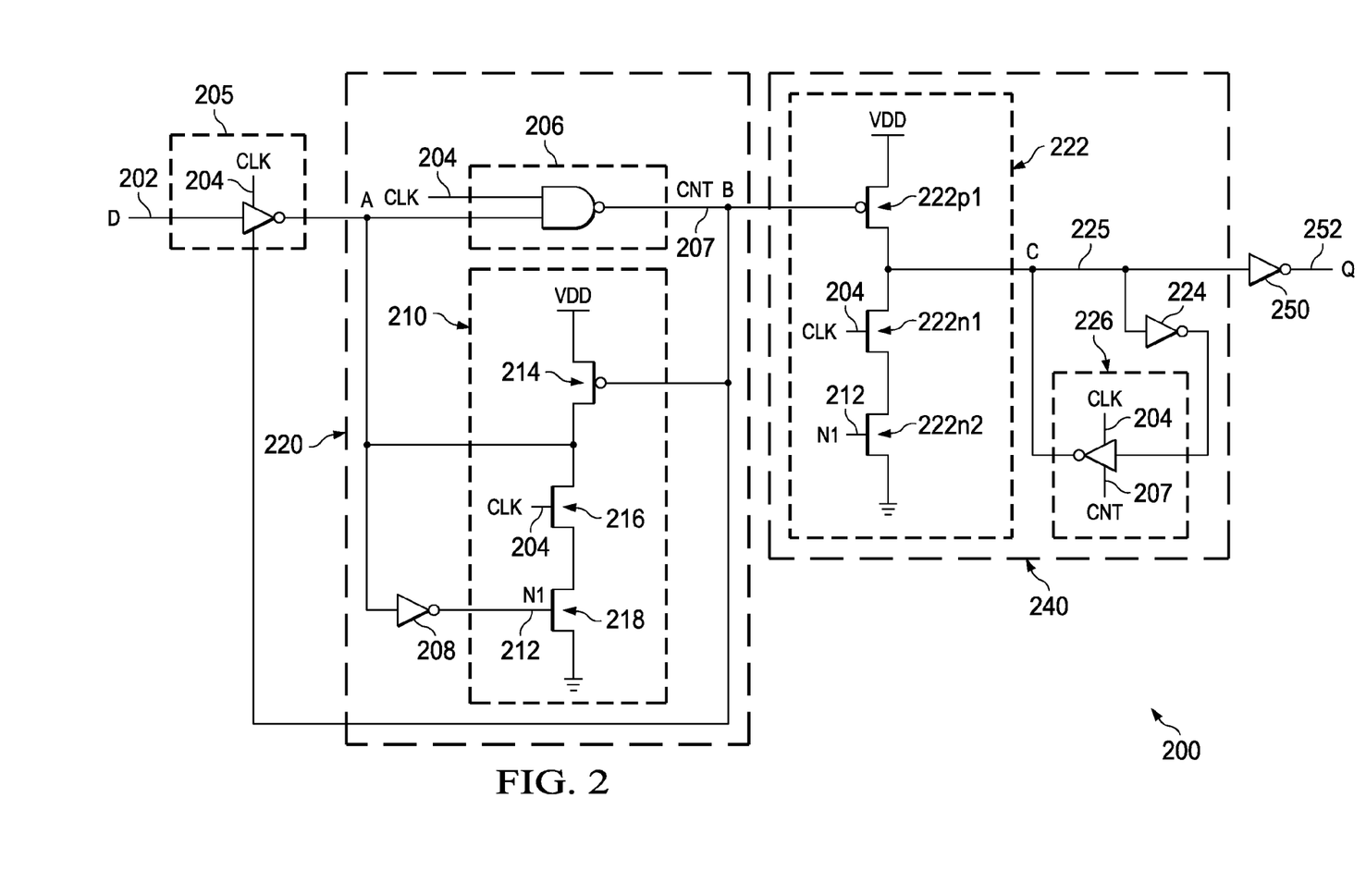
FIG. 2 illustrates a schematic of a flip-flop, according to an embodiment.

FIG. 2 illustrates a schematic of a flip-flop 200, according to an embodiment. The flip-flop 200 includes a tri-state inverter 205, a master latch 220, a slave latch 240 and an output inverter 250. The tri-state inverter 205 receives a flip-flop input (D) 202 and a clock input CLK 204. The master latch 220 is coupled to an output of the tri-state inverter 205. The master latch 220 includes a node 'A' that receives the output of the tri-state inverter 205. The node 'A' is coupled to an inverting logic gate 206. The inverting logic gate 206 receives the output of the tri-state inverter 205 and the clock input CLK 204.

An output of the inverting logic gate 206 is an output of the master latch 220. A node 'B' receives an output of the master latch. The output of the master latch 220 is a control signal (CNT) 207. The control signal (CNT) 207 is provided to the tri-state inverter 205. The master latch 220 includes a master inverter 208 coupled to the node 'A' and receives the output of the tri-state inverter 205. The master inverter 208 generates a first inverted output N1 212. The master latch 220 includes a master half tri-state inverter 210. The master half tri-state inverter 210 includes a third PMOS transistor 214. A gate terminal of the third PMOS transistor 214 is coupled to the node 'B'.

A third NMOS transistor 216 is coupled to a drain terminal of the third PMOS transistor 214. The drain terminal of third PMOS transistor 214 is coupled to node 'A' and receives the output of the tri-state inverter 205. A gate terminal of the third NMOS transistor receives the clock input CLK 204. A fourth NMOS transistor 218 is coupled to a source terminal of the third NMOS transistor 216. A gate terminal of the fourth NMOS transistor 218 is coupled to the master inverter 208 and receives the first inverted output N1 212.

The source terminal of the fourth NMOS transistor 218 and a source terminal of the third PMOS transistor 214 are coupled to a ground terminal and a power terminal ($V_{DD}$) respectively. The slave latch 240 receives the output of the master latch 220. The slave latch 240 is coupled to node 'B'. The slave latch 240 includes a slave half tri-state inverter 222 that receives the output of the master latch 220.

The slave half tri-state inverter 222 generates an output of the slave latch 240 on a slave path 225. A first slave inverter 224 in the slave latch 240 is coupled to the slave half tri-state inverter 222 through the slave path 225. The slave latch 240 also includes a slave tri-state inverter 226 coupled to the first slave inverter 224. The slave tri-state inverter 226 also receives the clock input CLK 204 and the control signal (CNT) 207. An output of the slave tri-state inverter 226 is coupled to a node 'C' on the slave path 225.

The slave half tri-state inverter 222 includes a seventh PMOS transistor 222p1. A gate terminal of the seventh PMOS transistor 222p1 receives the output of the master latch 220. A seventh NMOS transistor 222n1 is coupled to a drain terminal of the seventh PMOS transistor 222p1. A gate terminal of the seventh NMOS transistor 222n1 receives the clock input CLK 204.

An eighth NMOS transistor 222n2 is coupled to a source terminal of the seventh NMOS transistor 222n1. A gate terminal of the eighth NMOS transistor 222n2 receives the first inverted output N1 212. The drain terminal of the seventh PMOS transistor 222p1 is coupled to a drain terminal of the seventh NMOS transistor 222n1 to generate the output of the slave latch 240 on the slave path 225. A source terminal of the seventh PMOS transistor 222p1 is coupled to the power terminal ($V_{DD}$) and a source terminal of the eighth NMOS transistor 222n2 is coupled to the ground terminal.

The output inverter 250 is coupled to the output of the slave latch 240 and generates a flip-flop output Q 252. The output inverter 250 is coupled to the slave path 225 in the slave latch 240. In one example, the master latch 220 and the slave latch 240 are configured to receive at least one of a clear signal and a preset signal. The clear signal clear the bit values stored in the master latch 220 and the slave latch 240. The preset signal sets the bit values stored in the master latch 220 and the slave latch 240 to predefined values. The flip-flop 200 may include one or more additional components or inputs known to those skilled in the relevant art and are not discussed here for simplicity of the description.

The operation of the flip-flop 200 illustrated in FIG. 2 is explained now. In one example, the flip-flop 200 is a positive edge triggered flip-flop. The tri-state inverter 205 inverts the flip-flop input D 202 to generate the output of the tri-state inverter 205. The node 'A' receives the output of the tri-state inverter 205. The inverting logic gate 206 receives the clock input CLK 204 and the output of the tri-state inverter 205 and generates the control signal (CNT) 207.

In one embodiment, the inverting logic gate is a NAND gate. In another embodiment, the inverting logic gate 206 is a NAND gate when the flip-flop 200 is a positive edge triggered flip-flop and the inverting logic gate 206 is a NOR gate when the flip-flop 200 is a negative edge triggered flip-flop. The tri-state inverter 205 receives the control signal (CNT) 207. The control signal (CNT) 207 activates the tri-state inverter 205. In one example, the tri-state inverter 205 is activated on receiving the control signal (CNT) 207 and a defined phase of clock input CLK 204.

In one version, when the clock input CLK 204 is at logic '0' in a positive edge triggered flip-flop, the control signal (CNT) 207 and the clock input CLK 204 activates the tri-state inverter 205 such that the output of the tri-state inverter 205 is inverse of the flip-flop input D 202. The master inverter 208 receives the output of tri-state inverter 205 and generates the first inverted output N1 212.

The slave latch 240 receives the control signal (CNT) 207 from the master latch 220. The slave half tri-state inverter 222 receives the control signal (CNT) 207 from the master latch 220 and generates the output of the slave latch 240 on the slave path 225. The first slave inverter 224 receives the output of the slave latch 240 from the slave half tri-state inverter 222 and generates a feedback signal. The slave tri-state inverter 226 receives the feedback signal, the clock input CLK 204 and the control signal (CNT) 207. The output of the slave latch 240 on the slave path 225 is independent of the clock input CLK 204 in two versions. A first version is when the flip-flop input D 202 is at logic '0' for positive edge triggered flip-flop and a second version is when the flip-flop input D 202 is at logic '1' for negative edge triggered flip-flop. The output inverter 250 inverts the output of the slave latch 240 to generate the flip-flop output Q 252. In a steady state, the flip-flop output Q 252 is equal to the flip-flop input D 202.

The operation of the flip-flop 200 is now explained with the help of logic states. In a first state, the clock input CLK 204 is at logic '0' and the flip-flop input D 202 is at logic '0'. The output of the tri-state inverter 205 is at logic '1' i.e. node 'A' is at logic '1'. When the flip-flop 200 is a positive edge triggered flip, the inverting logic gate 206 is a NAND gate. Thus, node 'B' is at logic '1' i.e. the control signal (CNT) 207 generated by the inverting logic gate 206 is at logic '1'.

The control signal (CNT) 207 and the clock input CLK 204 activates the tri-state inverter 205. The logic '1' at node 'B' deactivates the third PMOS transistor 214. Since the clock input CLK 204 is at logic '0', the third NMOS transistor 216 is deactivated. Also, the first inverted output N1 212 generated by the master inverter 208 is at logic '0' which deactivates the fourth NMOS transistor 218.

The slave latch 240 is coupled to node 'B'. It is assumed that an initial value of the flip-flop output Q 252 is logic '1'. Thus, the feedback signal generated by the first slave inverter 224 is at logic '1'. The slave tri-state inverter 226 is activated because the clock input CLK 204 is at logic '0' and the control signal CNT 207 is at logic '1'. Hence, the output of the slave latch 240 generated by the slave tri-state inverter 226 is at logic '0'. Thus, node 'C' is at logic '0'. The output inverter 250 receives the logic '0' from node 'C' and therefore the flip-flop output Q 252 continues to be at logic '1'.

The first slave inverter 224 is coupled to the slave path 225 and hence generates the feedback signal which is at logic '1'. The feedback signal is at logic '1' and node 'B' is at logic '1'. The logic '1' at node 'B' deactivates the seventh PMOS transistor 222p1 and since the clock input CLK 204 is at logic '0', the seventh NMOS transistor 222n1 is also deactivated. The slave half tri-state inverter 222 output is not driving the node 'C' and therefore maintained at logic '0'. Thus there is no ambiguity of logic at the output of the slave latch 240. The node 'C' continues to be at logic '0'. Therefore, the flip-flop output Q 252 remains at logic '1'.

In a second state, the clock input CLK 204 transitions to logic '1' and the flip-flop input D 202 is still at logic '0'. The node 'A' continues to be at logic '1'. The output of the inverting logic gate 206 transitions to logic '0'. Thus, node 'B' is at logic '0' i.e. the control signal (CNT) 207 generated by the inverting logic gate 206 is at logic '0'. Thus, the control signal (CNT) 207 deactivates the tri-state inverter 205. The logic '0' at node 'B' activates the third PMOS transistor 214.

Thus, the drain terminal of the third PMOS transistor 214 is at logic '1' which is same as the logic at node 'A'. Thus, the node 'A' continues to be at logic '1' as it was in the first state. Thus, no ambiguity of logic occurs in the master latch 220. Since the clock input CLK 204 is at logic '1', the third NMOS transistor 216 is activated but the first inverted output N1 212 generated by the master inverter 208 is at logic '0' which deactivates the fourth NMOS transistor 218. The slave latch 240 is coupled to node 'B'. Since, the node 'B' is at logic '0', the output of the slave latch 240 generated by the slave half tri-state inverter 222 is at logic '1'. Thus, node 'C' is at logic '1'. The output inverter 250 receives the logic '1' from node 'C' and generates the flip-flop output Q 252 which is at logic '0'. The first slave inverter 224 is coupled to the slave path 225 and hence generates the feedback signal which transitions to logic '0'. As long as the node 'A' and the clock input CLK 204 are at logic '1', the node 'B' remains at logic '0' and as long as the node 'B' is at logic '0', the output of the slave latch 240 on the slave path 225 is at logic '1'. Therefore, the flip-flop output Q 252 remains at logic '0'.

In a third state, the clock input CLK 204 transitions to logic '0' and the flip-flop input D 202 transition to logic '1' from logic '0'. The output of the inverting logic gate 206 is at logic '1' because the clock input CLK 204 is at logic '0'. Thus, node 'B' is at logic '1' i.e. the control signal (CNT) 207 generated by the inverting logic gate 206 is at logic '1'. This activates the tri-state inverter 205 and the node 'A' transitions to logic '0'. The logic '1' at node 'B' deactivates the third PMOS transistor 214. Since the clock input CLK 204 is at logic '0', the third NMOS transistor 216 is deactivated but the first inverted output N1 212 generated by the master inverter 208 is at logic '1' which activates the fourth NMOS transistor 218.

The slave latch 240 is coupled to node 'B'. In the second state, the feedback signal was at logic '0'. The slave tri-state inverter 226 is activated since the clock input CLK 204 is at logic '0' and the control signal (CNT) 207 is at logic '1'. The slave tri-state inverter 226 generates a logic '1' at its output. Thus node 'C' was at logic '1'. The flip-flop output Q 252 is at logic '0'. Since the node 'A' is at logic '0', the first inverter output N1 212 is at logic '1'. Also, since the clock input CLK 204 is at logic '0', the slave half tri-state inverter 222 is not driving the node 'C'. Thus there is no ambiguity of logic since the output of the slave tri-state inverter 226 is at logic '1' and the output of the slave latch 240 on slave path 225 is also at logic '1'. Therefore, the flip-flop output Q 252 remains at logic '0'. The slave latch 240 holds a same value (logic '0') of the flip-flop output Q 252 as in the second state.

In a fourth state, the clock input CLK 204 transitions to logic '1' and the flip-flop input D 202 is still at logic '1'. In the third state, node 'A' was at logic '0'. Thus, the output of the inverting logic gate 206 remains at logic '1'. Thus, node 'B' is at logic '1' i.e. the control signal (CNT) 207 generated by the inverting logic gate 206 is at logic '1'. The control signal (CNT) 207 keeps the tri-state inverter 205 activated as long as the flip-flop input D 202 is at logic '1'. This does not create ambiguity of logic as the flip-flop input D 202 was at logic '1' before the clock input CLK 204 transitioned from logic '0' to logic '1' and thus the node 'A' is at logic '0'.

When the flip-flop input D 202 is at logic '1', the control signal (CNT) 207 for the tri-state inverter 205 remains active even after the clock input CLK transitions to logic '1'. However, the flip-flop input D 202 transitioning to logic '0' while the clock input CLK 204 is at logic '1' does not disturb the master latch 220 as only a part of the tri-state inverter 205 is active. Thus, there is a feedback and retention path for node 'A' and the master latch 220 remains at a correct logic even if the flip-flop input D 202 transitions from logic '1' to logic '0' after the clock input CLK 204 has transitioned to logic '1', i.e., a retention of logic in the master latch 220 is not dependent on the output of the tri-state inverter 205 when the clock input CLK 204 is at logic '1'.

The logic '1' at node 'B' deactivates the third PMOS transistor 214. Since the node 'A' is at logic '0', the output of master inverter 208, N1 212 is at logic '1' which activates the fourth NMOS transistor 218. The clock input CLK 204 is at logic '1' which activates the third NMOS transistor 216 and therefore the output of the master half tri-state inverter 210 is at logic '0' which is same as the logic at node 'A'. Thus, the node 'A' continues to be at logic '0' i.e. same logic state is in the third state. Thus, no ambiguity of logic occurs in the master latch 220.

The slave latch 240 is coupled to node 'B'. Since the clock input CLK 204 is at logic '1' and the output of master inverter 208, N1 212 is at logic '1', the output of the slave latch 240 generated by the slave half tri-state inverter 222 is at logic '0'. Thus, node 'C' is at logic '0'. The output inverter 250 receives the logic '0' from node 'C' and generates the flip-flop output Q 252 which is at logic '1'. The first slave inverter 224 is coupled to the slave path 225 and generates the feedback signal which transitions to logic '1'. Therefore, the flip-flop output Q 252 remains at logic '1'. The slave tri-state inverter 226 receives the feedback signal which is at logic '1' and the clock input CLK 204 which is at logic '1' and the control signal (CNT) 207 which is at logic '1'. Thus the output of the slave tri-state inverter 226 is at logic '0' so there is no ambiguity because the node 'C' is also at logic '0' The table 1 summarizes the states of the flip-flop 200.

TABLE 1

|  | Node 'A' | Node 'B' | Q | Node 'C' | Feedback Signal | N1 |
|---|---|---|---|---|---|---|
| Clk = 0, D = 0 | 1 | 1 | 1 | 0 | 1 | 0 |
| Clk = 1, D = 0 | 1 | 0 | 0 | 1 | 0 | 0 |
| Clk = 0, D = 1 | 0 | 1 | 0 | 1 | 0 | 1 |
| Clk = 1, D = 1 | 0 | 1 | 1 | 0 | 1 | 1 |

Figure 3:
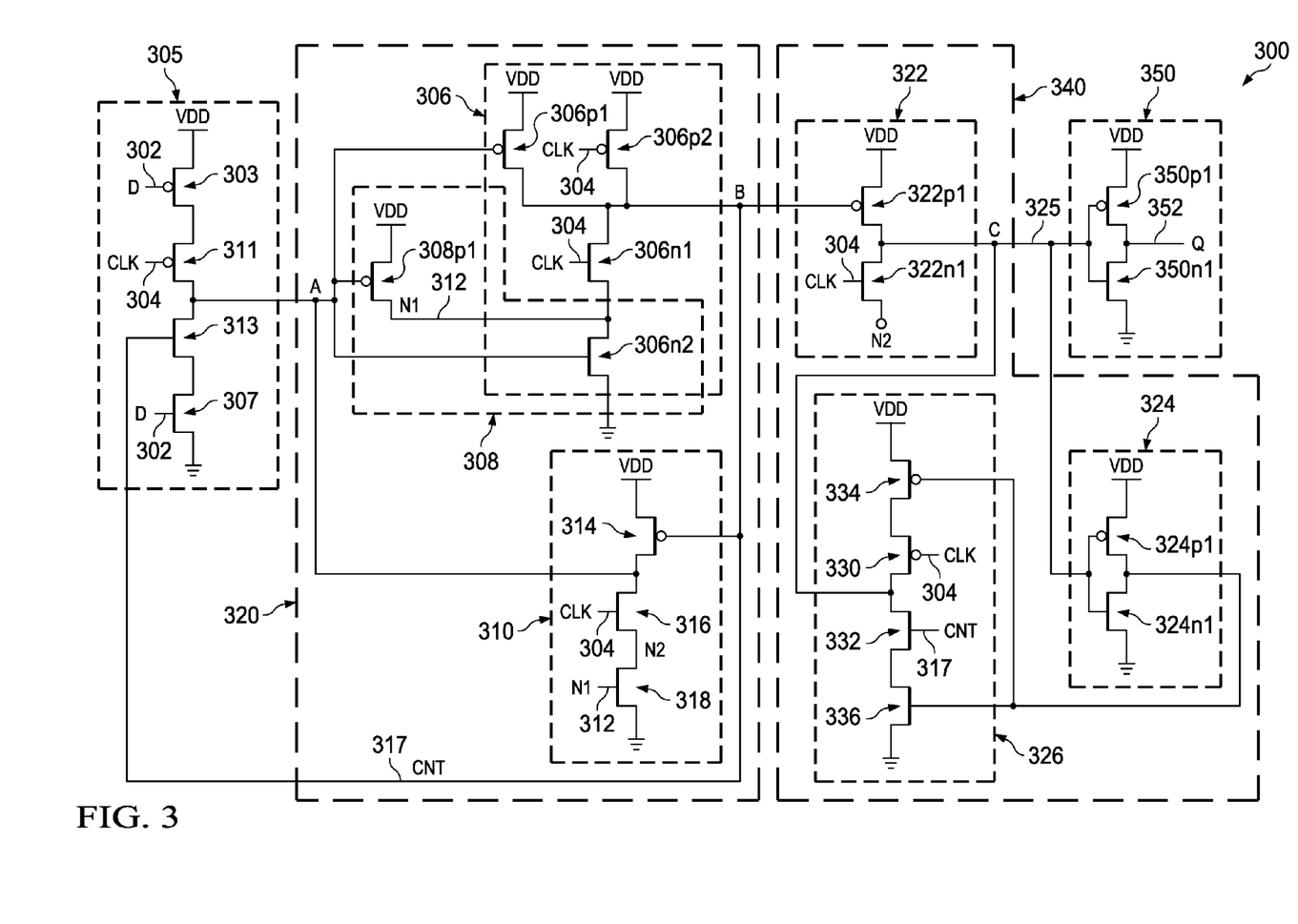
FIG. 3 illustrates a schematic of a transistor level implementation of a flip-flop, according to an embodiment.

FIG. 3 illustrates a schematic of a transistor level implementation of a flip-flop 300, according to an embodiment. The flip-flop 300 is a transistor level implementation of the flip-flop 200. The flip-flop 300 includes a tri-state inverter 305, a master latch 320, a slave latch 340 and an output inverter 350. The tri-state inverter 305 receives a flip-flop input (D) 302 and a clock input CLK 304.

The tri-state inverter 305 includes a first PMOS transistor 303 and a first NMOS transistor 307. A gate terminal of the first PMOS transistor 303 and a gate terminal of the first NMOS transistor 307 receives the flip-flop input (D) 302. A second PMOS transistor 311 is coupled to a drain terminal of the first PMOS transistor 303 and a second NMOS transistor 313 is coupled to a drain terminal of the first NMOS transistor 307. A drain terminal of the second PMOS transistor 311 and a drain terminal of the second NMOS transistor 313 are coupled to generate an output of the tri-state inverter 305. A source terminal of the first PMOS transistor 303 is coupled to a power terminal ($V_{DD}$) and a source terminal of the first NMOS transistor 307 is coupled to a ground terminal.

When the flip-flop 300 is a positive edge triggered flip-flop, a gate terminal of the second PMOS transistor 311 receives the clock input CLK 304 and a gate terminal of the second NMOS transistor 313 receives a control signal (CNT) 317. The master latch 320 is coupled to an output of the tri-state inverter 305. The master latch 320 includes a node 'A' that receives the output of the tri-state inverter 305. The node 'A' is coupled to an inverting logic gate 306. The inverting logic gate 306 receives the output of the tri-state inverter 305 and the clock input CLK 304.

The inverting logic gate 306 includes a PMOS transistor 306p1, an NMOS transistor 306n1, a PMOS transistor 306p2 and an NMOS transistor 306n2. A gate terminal of the PMOS transistor 306p1 and a gate terminal of the NMOS transistor 306n2 receive the output of the tri-state inverter 305. A gate terminal of the PMOS transistor 306p2 and a gate terminal of the NMOS transistor 306n1 receive the clock input CLK 304. A source terminal of the PMOS transistor 306p1 and a source terminal of the PMOS transistor 306p2 are coupled to the power terminal ($V_{DD}$). A source terminal of the NMOS transistor 306n2 is coupled to the ground terminal. A drain terminal of the PMOS transistor 306p1 and a drain terminal of the PMOS transistor 306p2 are coupled to a drain terminal of the NMOS transistor 306n1 at the node 'B' 317.

An output of the inverting logic gate 306 is an output of the master latch 320. The node 'B' receives the output of the master latch 320. The output of the master latch 320 is the control signal (CNT) 317. The master latch 320 includes a master inverter 308 coupled to node 'A' and receives the output of the tri-state inverter 305. The master inverter 308 includes a PMOS transistor 308p1 and the NMOS transistor 306n2. A gate terminal of the PMOS transistor 308p1 and a gate terminal of the NMOS transistor 306n2 receive the output of the tri-state inverter 305. The master inverter 308 generates a first inverted output N1 312.

The master latch 320 includes a master half tri-state inverter 310. The master half tri-state inverter 310 includes a third PMOS transistor 314. A gate terminal of the third PMOS transistor 314 is coupled to the node 'B'. A third NMOS transistor 316 is coupled to a drain terminal of the third PMOS transistor 314. The drain terminal of the third PMOS transistor 314 and a drain terminal of the third NMOS transistor 316 are coupled to each other and to the node 'A'. A gate terminal of the third NMOS transistor 316 receives the clock input CLK 304.

A fourth NMOS transistor 318 is coupled to a source terminal of the third NMOS transistor 316. A gate terminal of the fourth NMOS transistor 318 is coupled to the master inverter 308 and receives the first inverted output N1 312. The source terminal of the third NMOS transistor 316 is coupled to a drain terminal of the fourth NMOS transistor 318 to form a node 'N2'. The source terminal of the fourth NMOS transistor 318 and a source terminal of the third PMOS transistor 314 are coupled to the ground terminal and the power terminal ($V_{DD}$) respectively.

The slave latch 340 receives an output of the master latch 320 which is the control signal (CNT) 317. The slave latch 340 is coupled to the node 'B'. The slave latch 340 includes a slave half tri-state inverter 322 that receives the output of the master latch 320.

The slave half tri-state inverter 322 includes a seventh PMOS transistor 322p1. A gate terminal of the seventh PMOS transistor 322p1 receives the output of the master latch 320 which is the control signal (CNT) 317. A seventh NMOS transistor 322n1 is coupled to a drain terminal of the seventh PMOS transistor 322p1. A gate terminal of the seventh NMOS transistor 322n1 receives the clock input CLK 304.

A source terminal of the seventh NMOS transistor 322n1 is coupled to the node 'N2'. Thus, the fourth NMOS transistor 318 acts as an eighth NMOS transistor. A gate terminal of the eighth NMOS transistor (fourth NMOS transistor 318) receives the first inverted output N1 212. The drain terminal of the seventh PMOS transistor 322p1 is coupled to a drain terminal of the seventh NMOS transistor 322n1 to generate an output of the slave latch 340 on a slave path 325.

A source terminal of the seventh PMOS transistor 322p1 is coupled to the power terminal ($V_{DD}$) and a source terminal of the eighth NMOS transistor (fourth NMOS transistor 318) is coupled to the ground terminal. A first slave inverter 324 in the slave latch 340 is coupled to the slave half tri-state inverter 322 through the slave path 325. The slave latch 340 also includes a slave tri-state inverter 326 coupled to the first slave inverter 324.

The first slave inverter 324 includes a PMOS transistor 324p1 and an NMOS transistor 324n1. A gate terminal of the PMOS transistor 324p1 and a gate terminal of the NMOS transistor 324n1 are configured to receive the output of the slave latch 340. A source terminal of the PMOS transistor 324p1 is coupled to the power terminal ($V_{DD}$) and a source terminal of the NMOS transistor 324n1 is coupled to the ground terminal. A drain terminal of the PMOS transistor 324p1 and a drain terminal of the NMOS transistor 324n1 are coupled to generate a feedback signal. The slave tri-state inverter 326 includes a fifth PMOS transistor 330 coupled to a fifth NMOS transistor 332.

A gate terminal of the fifth PMOS transistor 330 receives the clock input CLK 304. The fifth NMOS transistor 332 is coupled to a drain terminal of the fifth PMOS transistor 330. A gate terminal of the fifth NMOS transistor 332 receives the control signal (CNT) 317. The slave tri-state inverter 326 also includes a sixth PMOS transistor 334 and a sixth NMOS transistor 336. The sixth PMOS transistor 334 is coupled to a source terminal of the fifth PMOS transistor 330 and the sixth NMOS transistor 336 is coupled to a source terminal of the fifth NMOS transistor 332. A gate terminal of each of the sixth PMOS transistor 334 and the sixth NMOS transistor 336 receives the feedback signal from the first slave inverter 324. A source terminal of the sixth NMOS transistor 336 and a source terminal of the sixth PMOS transistor 334 are coupled to the ground terminal and the power terminal ($V_{DD}$) respectively.

A drain terminal of the fifth PMOS transistor 330 and a drain terminal of the fifth NMOS transistor 332 are coupled to the slave path 325 at node 'C'. The slave half tri-state inverter 322 is coupled to the first slave inverter 324. The output inverter 350 is coupled to an output of the slave latch 340 and generates a flip-flop output Q 352. The output inverter 350 is coupled to the slave path 325 in the slave latch 340.

The output inverter 350 includes a PMOS transistor 350p1 and an NMOS transistor 350n1. A gate terminal of the PMOS transistor 350p1 and a gate terminal of the NMOS transistor 350n1 are configured to receive the output of the slave latch 340. A source terminal of the PMOS transistor 350p1 is coupled to the power terminal ($V_{DD}$) and a source terminal of the NMOS transistor 350n1 is coupled to the ground terminal.

A drain terminal of the PMOS transistor 350p1 and a drain terminal of the NMOS transistor 350n1 are coupled to generate the flip-flop output Q 352. In one example, the master latch 320 and the slave latch 340 are configured to receive at least one of a clear signal and a preset signal. The clear signal clears the bit values stored in the master latch 320 and the slave latch 340. The preset signal sets the bit values stored in the master latch 320 and the slave latch 340 to predefined values. The operation of the flip-flop 300 is similar to the operation of the flip-flop 200 and is thus not explained here for brevity of the description.

Figure 4:
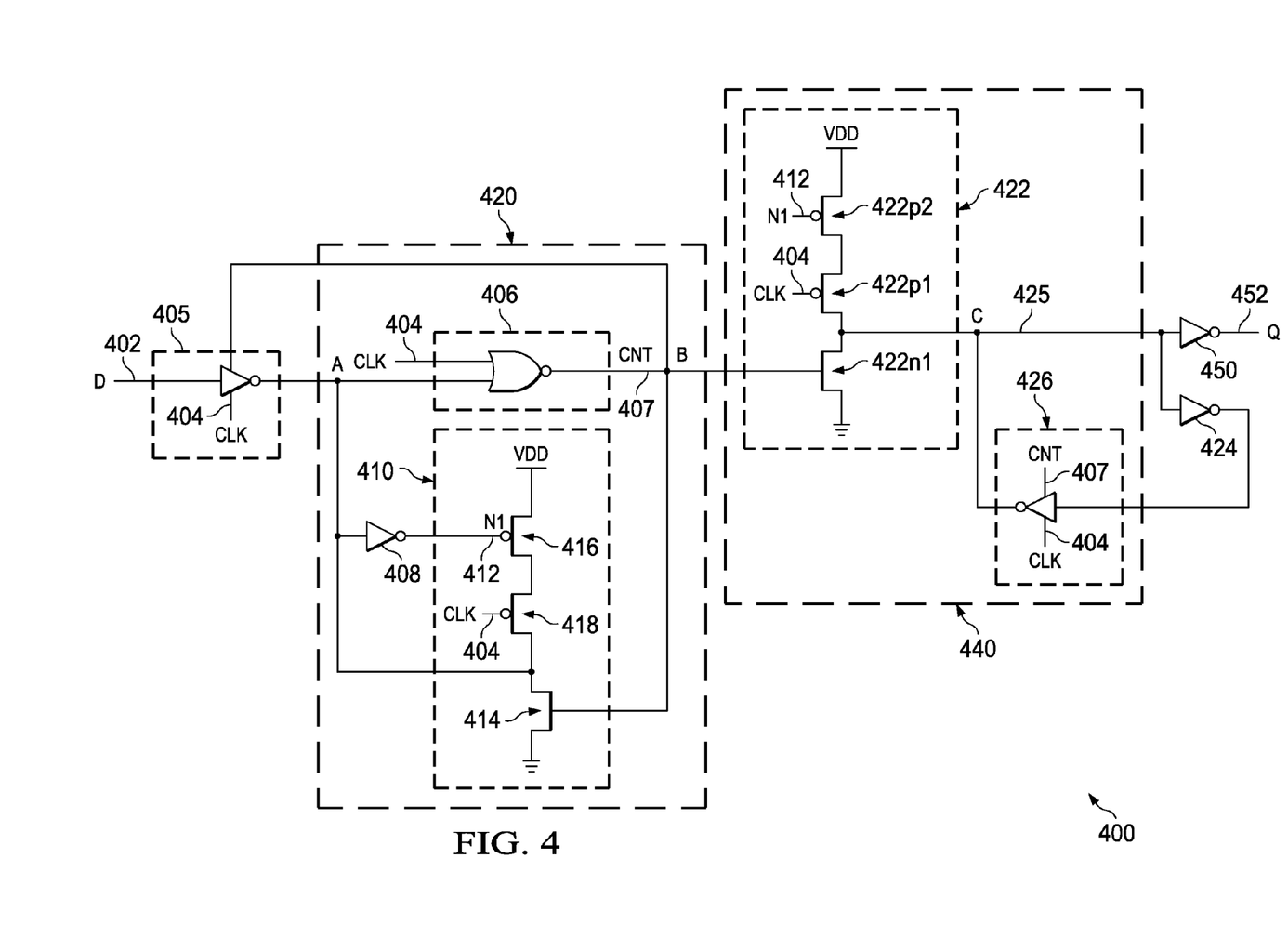
FIG. 4 illustrates a schematic of a flip-flop, according to an embodiment.

FIG. 4 illustrates a schematic of a flip-flop 400, according to an embodiment. The flip-flop 400 includes a tri-state inverter 405, a master latch 420, a slave latch 440 and an output inverter 450. The tri-state inverter 405 receives a flip-flop input (D) 402 and a clock input CLK 404. The master latch 420 is coupled to an output of the tri-state inverter 405. The master latch 420 includes a node A that receives the output of the tri-state inverter 405. The node 'A' is coupled to an inverting logic gate 406. The inverting logic gate 406 receives the output of the tri-state inverter 405 and the clock input CLK 404.

An output of the inverting logic gate 406 is an output of the master latch 420. A node 'B' receives an output of the master latch. The output of the master latch 420 is a control signal (CNT) 407. The control signal (CNT) 407 is provided to the tri-state inverter 405. The master latch 420 includes a master inverter 408 coupled to the node 'A' and receives the output of the tri-state inverter 405. The master inverter 408 generates a first inverted output N1 412. The master latch 420 includes a master half tri-state inverter 410. The master half tri-state inverter 410 includes a third NMOS transistor 414. A gate terminal of the third NMOS transistor 414 is coupled to the node 'B'.

A fourth PMOS transistor 418 is coupled to a drain terminal of the third NMOS transistor 414. A gate terminal of the fourth PMOS transistor 418 receives the clock input CLK 404. A third PMOS transistor 416 is coupled to a source terminal of the fourth PMOS transistor 418. A gate terminal of the third PMOS transistor 416 is coupled to the master inverter 408 and receives the first inverted output N1 412. The drain terminal of third NMOS transistor 414 and a drain terminal of fourth PMOS transistor 418 are coupled to node 'A' and receives the output of the tri-state inverter 405.

The source terminal of the third PMOS transistor 416 and a source terminal of the third NMOS transistor 414 are coupled to a power terminal ($V_{DD}$) and a ground terminal respectively. The slave latch 440 receives an output of the master latch 420. The slave latch 440 is coupled to node 'B'. The slave latch 440 includes a slave half tri-state inverter 422 that receives the output of the master latch 420.

The slave half tri-state inverter 422 generates an output of the slave latch 440 on a slave path 425. A first slave inverter 424 in the slave latch 440 is coupled to the slave half tri-state inverter 422 through the slave path 425. The slave latch 440 also includes a slave tri-state inverter 426 coupled to the first slave inverter 424. The slave tri-state inverter 426 also receives the clock input CLK 404 and the control signal (CNT) 407. An output of the slave tri-state inverter 426 is coupled to a node 'C' on the slave path 425.

The slave half tri-state inverter 422 includes a seventh NMOS transistor 422n1. A gate terminal of the seventh NMOS transistor 422n1 receives the output of the master latch 420. A seventh PMOS transistor 422p1 is coupled to a drain terminal of the seventh NMOS transistor 422n1. A gate terminal of the seventh PMOS transistor 422p1 receives the clock input CLK 404.

An eighth PMOS transistor 422p2 is coupled to a source terminal of the seventh PMOS transistor 422p1. A gate terminal of the eighth PMOS transistor 422p2 receives the first inverted output N1 412. The drain terminal of the seventh NMOS transistor 422n1 is coupled to a drain terminal of the seventh PMOS transistor 422p1 to generate the output of the slave latch 440 on the slave path 425. A source terminal of the eighth PMOS transistor 422p2 and a source terminal of the seventh NMOS transistor 422n1 are coupled to the power terminal ($V_{DD}$) and the ground terminal respectively.

The output inverter 450 is coupled to the output of the slave latch 440 and generates a flip-flop output Q 452. The output inverter 450 is coupled to the slave path 425 in the slave latch 440. In one example, the master latch 420 and the slave latch 440 are configured to receive at least one of a clear signal and a preset signal. The clear signal clear the bit values stored in the master latch 420 and the slave latch 440. The preset signal sets the bit values stored in the master latch 420 and the slave latch 440 to predefined values. The flip-flop 400 may include one or more additional components or inputs known to those skilled in the relevant art and are not discussed here for simplicity of the description.

The operation of the flip-flop 400 illustrated in FIG. 4 is explained now. In one example, the flip-flop 400 is a negative edge triggered flip-flop. The tri-state inverter 405 inverts the flip-flop input D 402 to generate the output of the tri-state inverter 405. The node 'A' receives the output of the tri-state inverter 405. The inverting logic gate 406 receives the clock input CLK 404 and the output of the tri-state inverter 405 and generates the control signal (CNT) 407.

In this embodiment, the inverting logic gate 406 is a NOR gate. The tri-state inverter 405 receives the control signal (CNT) 407. The control signal (CNT) 407 activates the tri-state inverter 405. In one example, the tri-state inverter 405 is activated on receiving the control signal (CNT) 407 and a defined phase of clock input CLK 404.

In one version, when the clock input CLK 404 is at logic '1' in a negative edge triggered flip-flop, the control signal (CNT) 407 and the clock input CLK 404 activates the tri-state inverter 405 such that the output of the tri-state inverter 405 is inverse of the flip-flop input D 402. The master inverter 408 receives the output of tri-state inverter 405 and generates a first inverted output N1 412.

The slave latch 440 receives the control signal (CNT) 407 from the master latch 420. The slave half tri-state inverter 422 receives the control signal (CNT) 407 from the master latch 420 and generates the output of the slave latch 440 on the slave path 425. The first slave inverter 424 receives the output of the slave latch 440 from the slave half tri-state inverter 422 and generates a feedback signal. The slave tri-state inverter 426 receives the feedback signal, the clock input CLK 404 and the control signal (CNT) 407. The output of the slave latch 440 on the slave path 425 is independent of the clock input CLK 404 in two versions. A first version is when the flip-flop input D 402 is at logic '0' for positive edge triggered flip-flop and a second version is when the flip-flop input D 402 is at logic '1' for negative edge triggered flip-flop. The output inverter 450 inverts the output of the slave latch 440 to generate the flip-flop output Q 452. In a steady state, the flip-flop output Q 452 is equal to the flip-flop input D 402.

The operation of the flip-flop 400 is now explained with the help of logic states. In a first state, the clock input CLK 404 is at logic '1' and the flip-flop input D 402 is at logic '1'. The output of the tri-state inverter 405 is at logic '0' i.e. node 'A' is at logic '0'. When the flip-flop 400 is a negative edge triggered flip, the inverting logic gate 406 is a NOR gate.

Since the clock input CLK 404 is at logic '1', node 'B' is at logic '0' i.e. the control signal (CNT) 407 generated by the inverting logic gate 406 is at logic '0'. The control signal (CNT) 407 and the clock input CLK 404 activates the tri-state inverter 405. The logic '0' at node 'B' deactivates the third NMOS transistor 414. Since the clock input CLK 404 is at logic '1', the fourth PMOS transistor 418 is deactivated. Also, the first inverted output N1 412 generated by the master inverter 408 is at logic '1' which deactivates the third PMOS transistor 416.

The slave latch 440 is coupled to node 'B'. It is assumed that an initial value of the flip-flop output Q 452 is logic '0'. Thus, the feedback signal generated by the first slave inverter 424 is at logic '0'. Since node 'B' is at logic '0' and clock input CLK 404 is at logic '1', the output of the slave latch 440 generated by the slave tri-state inverter 426 is at logic '1'. Thus, node 'C' is at logic '1'. The output inverter 450 receives the logic '1' from node 'C' and therefore the flip-flop output Q 452 continues to be at logic '0'.

The first slave inverter 424 is coupled to the slave path 425 and hence generates the feedback signal which is at logic '0'. Since the feedback signal is at logic '0' and node 'B' is at logic '0' because the clock input CLK 404 being at logic '1', the slave half tri-state inverter 422 is deactivated. Thus there is no ambiguity of logic at the output of the slave latch 440. The node 'C' continues to be at logic '1'. Therefore, the flip-flop output Q 452 remains at logic '0'.

In a second state, the clock input CLK 404 transitions to logic '0' and the flip-flop input D 402 is still at logic '1'. The node 'A' continues to be at logic '0'. The output of the inverting logic gate 406 transitions to logic '1'. Thus, node 'B' is at logic '1' i.e. the control signal (CNT) 407 generated by the inverting logic gate 406 is at logic '1'. Thus, the control signal (CNT) 407 deactivates the tri-state inverter 405. The logic '1' at node 'B' activates the third NMOS transistor 414 and therefore, the master half tri-state inverter 410 generates logic '0'.

Thus, the node 'A' continues to be at logic '0' as it was in the first state. Thus, no ambiguity of logic occurs in the master latch 420. Since the clock input CLK 404 is at logic '0', the fourth PMOS transistor 418 is activated but the first inverted output N1 412 generated by the master inverter 408 is at logic '1' which deactivates the third PMOS transistor 416.

The slave latch 440 is coupled to node 'B'. Since, the node 'B' is at logic '1', the output of the slave latch 440 generated by the slave half tri-state inverter 422 is at logic '0'. Thus, node 'C' is at logic '0'. The output inverter 450 receives the logic '0' from node 'C' and generates the flip-flop output Q 452 which transitions to logic '1'. The first slave inverter 424 is coupled to the slave path 425 and hence generates the feedback signal which transitions to logic '1'. As long as the node 'A' and the clock input CLK 404 are at logic '0', the node 'B' remains at logic '1' and as long as the node 'B' is at logic '1', the output of the slave latch 440 on the slave path 425 is at logic '0'. Therefore, the flip-flop output Q 452 remains at logic '1'.

In a third state, the clock input CLK 404 transition to logic '1' and the flip-flop input D 402 transitions to logic '0' from logic '1'. The output of the inverting logic gate 406 is at logic '0' because the clock input CLK 404 is at logic '1'. Thus, node 'B' is at logic '0' i.e. the control signal (CNT) 407 generated by the inverting logic gate 406 is at logic '0'. This activates the tri-state inverter 405 and the node 'A' transitions to logic '1'. The logic '0' at node 'B' deactivates the third NMOS transistor 414. Since the clock input CLK 404 is at logic '1', the fourth PMOS transistor 418 is deactivated.

The slave latch 440 is coupled to node 'B'. In the second state, the feedback signal was at logic '1'. Now, the clock input CLK 404 is at logic '1' and the control signal (CNT) 407 is at logic '0', the slave tri-state inverter 426 generates logic '0' at the output of the slave latch 440 on the slave path 425. Thus node 'C' is at logic '0'. The flip-flop output Q 452 is at logic '1'. Thus there is no ambiguity of logic since the output of the slave tri-state inverter 426 is at logic '0' and the output of the slave latch 440 on slave path 425 is also at logic '0'. Therefore, the flip-flop output Q 452 remains at logic '1'.

In a fourth state, the clock input CLK 404 transitions to logic '0' and the flip-flop input D 402 is still at logic '0'. In the third state, node 'A' was at logic '1'. Thus, the output of the inverting logic gate 406 remains at logic '0'. Thus, node 'B' is at logic '0' i.e. the control signal (CNT) 407 generated by the inverting logic gate 406 is at logic '0'. The control signal (CNT) 407 keeps the tri-state inverter 405 activated as long as the flip-flop input D 402 is at logic '0'. This does not create ambiguity of logic as the flip-flop input D 402 was at logic '0' before the clock input CLK 404 transitioned from logic '1' to logic '0' and thus the node 'A' is at logic '1'.

When the flip-flop input D 402 is at logic '0', the control signal (CNT) 407 for the tri-state inverter 405 remains active even after the clock input CLK transitions to logic '0'. However, the flip-flop input D 402 transitioning to logic '1' while the clock input CLK 404 is at logic '0' does not disturb the master latch 420 as only a part of the tri-state inverter 405 is active. Thus, there is a feedback and retention path for node 'A' and the master latch 420 remains at a correct logic even if the flip-flop input D 402 transitions from logic '0' to logic '1' after the clock input CLK 404 has transitioned to logic '0', i.e., a retention of logic in the master latch 420 is not dependent on the output of the tri-state inverter 405 when the clock input CLK 404 is at logic '0'.

The logic '0' at node 'B' deactivates the third NMOS transistor 414. Since the node 'A' is at logic '1', the output of master inverter 408, N1 412 is at logic '0' which activates the third PMOS transistor 416. The clock input CLK 404 is at logic '0' which activates the fourth PMOS transistor 418 and therefore the output of the master half tri-state inverter 410 is at logic '1' which is same as the logic at node 'A'. Thus, the node 'A' continues to be at logic '1' i.e. same logic state is in the third state. Thus, no ambiguity of logic occurs in the master latch 420. Thus, the master latch 420 holds a same value (i.e. logic '0') of the flip-flop input D 402 as in the third state.

The slave latch 440 is coupled to node 'B'. Since the clock input CLK 404 is at logic '0' and the output of master inverter 408, N1 412 is at logic '0', the output of the slave latch 440 generated by the slave half tri-state inverter 422 is at logic '1'. Thus, node 'C' is at logic '1'. The output inverter 450 receives the logic '1' from node 'C' and generates the flip-flop output Q 452 which is at logic '0'. The first slave inverter 424 is coupled to the slave path 425 and generates the feedback signal which transitions to logic '0'. Because the control signal (CNT) 407 is at logic '0' and feedback signal is at logic '0', the output of slave tri-state inverter 426 generated at the node 'C' is at logic '1'. Thus there is no ambiguity of logic. Therefore, the flip-flop output Q 452 remains at logic '0'. The table 2 summarizes the states of the flip-flop 400.

TABLE 2

|  | Node 'A' | Node 'B' | Q | Node 'C' | Feedback Signal | N1 |
|---|---|---|---|---|---|---|
| Clk = 1, D = 1 | 0 | 0 | 0 | 1 | 0 | 1 |
| Clk = 0, D = 1 | 0 | 1 | 1 | 0 | 1 | 1 |
| Clk = 1, D = 0 | 1 | 0 | 1 | 0 | 1 | 0 |
| Clk = 0, D = 0 | 1 | 0 | 0 | 1 | 0 | 0 |

Figure 5:
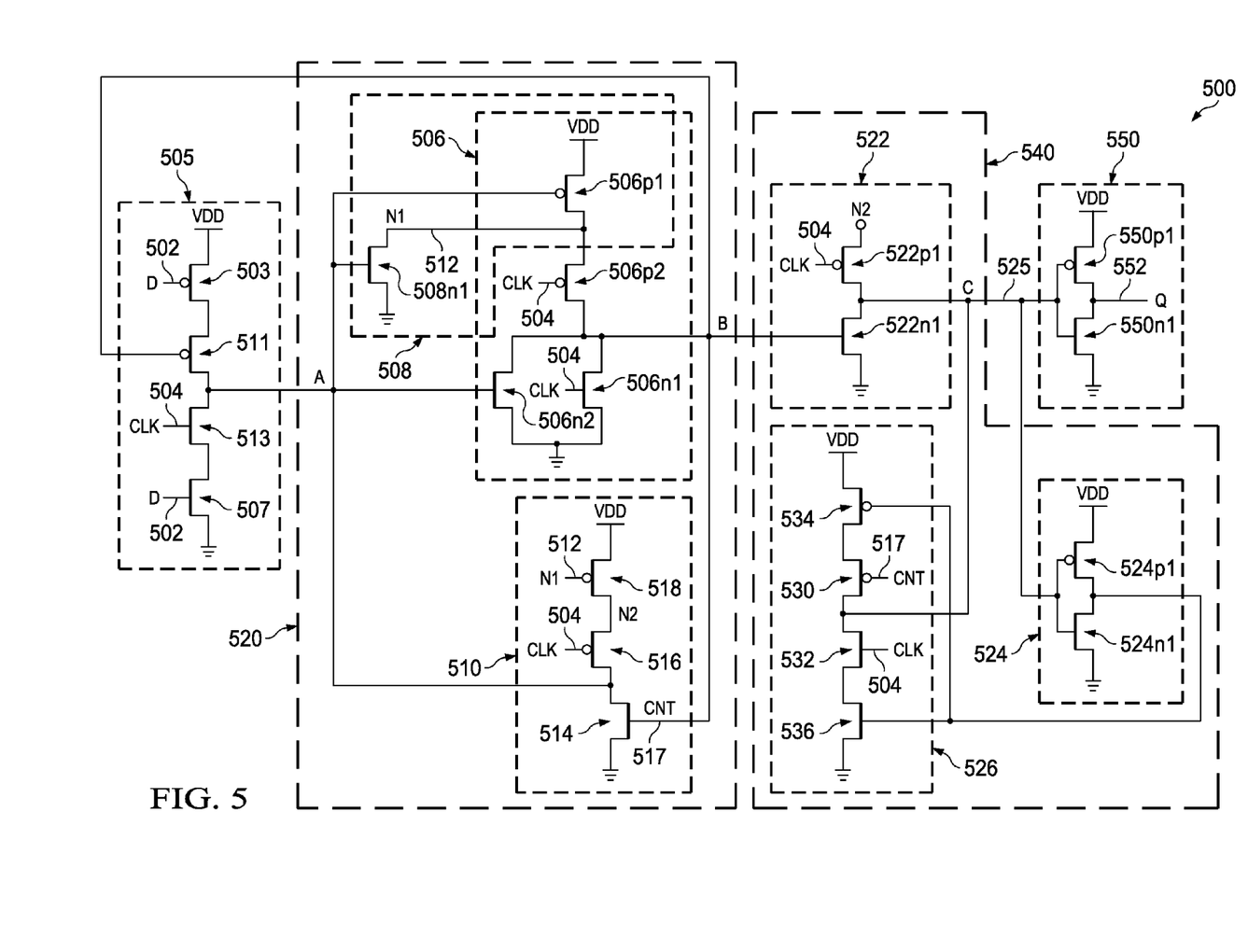
FIG. 5 illustrates a schematic of a transistor level implementation of a flip-flop, according to an embodiment.

FIG. 5 illustrates a schematic of a transistor level implementation of a flip-flop 500, according to an embodiment. The flip-flop 500 is a transistor level implementation of the flip-flop 400. The flip-flop 500 includes a tri-state inverter 505, a master latch 520, a slave latch 540 and an output inverter 550. The tri-state inverter 505 receives a flip-flop input (D) 502 and a clock input CLK 504.

The tri-state inverter 505 includes a first PMOS transistor 503 and a first NMOS transistor 507. A gate terminal of the first PMOS transistor 503 and a gate terminal of the first NMOS transistor 507 receives the flip-flop input (D) 502. A second PMOS transistor 511 is coupled to a drain terminal of the first PMOS transistor 503 and a second NMOS transistor 513 is coupled to a drain terminal of the first NMOS transistor 507.

A drain terminal of the second PMOS transistor 511 and a drain terminal of the second NMOS transistor 513 are coupled to generate an output of the tri-state inverter 505. A source terminal of the first PMOS transistor 503 is coupled to a power terminal ($V_{DD}$) and a source terminal of the first NMOS transistor 507 is coupled to a ground terminal.

When the flip-flop 500 is a negative edge triggered flip-flop, the gate terminal of the second PMOS transistor 511 receives a control signal (CNT) 517 and the gate terminal of the second NMOS transistor 513 receives the clock input CLK 504.

The master latch 520 is coupled to an output of the tri-state inverter 505. The master latch 520 includes a node 'A' that receives the output of the tri-state inverter 505. The node 'A' is coupled to an inverting logic gate 506. The inverting logic gate 506 receives the output of the tri-state inverter 505 and the clock input CLK 504.

The inverting logic gate 506 includes a PMOS transistor 506p1, an NMOS transistor 506n1, a PMOS transistor 506p2 and an NMOS transistor 506n2. A gate terminal of the PMOS transistor 506p1 and a gate terminal of the NMOS transistor 506n2 receive the output of the tri-state inverter 505. A gate terminal of the PMOS transistor 506p2 and a gate terminal of the NMOS transistor 506n1 receive the clock input CLK 504.

A source terminal of the PMOS transistor 506p1 is coupled to the power terminal ($V_{DD}$). A source terminal of the NMOS transistor 506n2 and a source terminal of the NMOS transistor 506n1 are coupled to the ground terminal. A drain terminal of PMOS transistor 506p1 is coupled to the source terminal of PMOS transistor 506p2. A drain terminal of the PMOS transistor 506p2 and a drain terminal of the NMOS transistor 506n1 are coupled to a drain terminal of the NMOS transistor 506n2 and generate an output of the inverting logic gate 506 at a node 'B' 517.

An output of the inverting logic gate 506 is an output of the master latch 520. The node 'B' receives the output of the master latch 520. The output of the master latch 520 is the control signal (CNT) 517. The master latch 520 includes a master inverter 508 coupled to node 'A' and receives the output of the tri-state inverter 505. The master inverter 508 includes a PMOS transistor 506p1 and the NMOS transistor 508n1.

A gate terminal of the PMOS transistor 506p1 and a gate terminal of the NMOS transistor 508n1 receive the output of the tri-state inverter 505. The master inverter 508 generates a first inverted output N1 512. A drain terminal of the PMOS transistor 506p1 and a source terminal of the PMOS transistor 506p2 are coupled to a drain terminal of the NMOS transistor 508n1.

The master latch 520 includes a master half tri-state inverter 510. The master half tri-state inverter 510 includes a third NMOS transistor 514. A gate terminal of the third NMOS transistor 514 is coupled to the node 'B'. A third PMOS transistor 516 is coupled to a drain terminal of the third NMOS transistor 514. A gate terminal of the third PMOS transistor 516 receives the clock input CLK 504. A fourth PMOS transistor 518 is coupled to a source terminal of the third PMOS transistor 516. A gate terminal of the fourth PMOS transistor 518 is coupled to the master inverter 508 and receives the first inverted output N1 512. The source terminal of the third PMOS transistor 516 is coupled to a drain terminal of the fourth PMOS transistor 518 to form a node 'N2'. The drain terminal of the third PMOS transistor 516 and the drain terminal of the third NMOS transistor 514 are coupled to node 'A'.

The source terminal of the fourth PMOS transistor 518 and a source terminal of the third NMOS transistor 514 are coupled to the power terminal ($V_{DD}$) and the ground terminal respectively. The slave latch 540 receives an output of the master latch 520 which is the control signal (CNT) 517. The slave latch 540 is coupled to the node 'B'. The slave latch 540 includes a slave half tri-state inverter 522 that receives the output of the master latch 520.

The slave half tri-state inverter 522 includes a seventh NMOS transistor 522n1. A gate terminal of the seventh NMOS transistor 522n1 receives the output of the master latch 520 which is the control signal (CNT) 517. A seventh PMOS transistor 522p1 is coupled to a drain terminal of the seventh NMOS transistor 522n1. A gate terminal of the seventh PMOS transistor 522p1 receives the clock input CLK 504.

A source terminal of the seventh PMOS transistor 522p1 is coupled to the node 'N2'. Thus, the fourth PMOS transistor 518 acts as an eighth PMOS transistor. A gate terminal of the eighth PMOS transistor (fourth PMOS transistor 518) receives the first inverted output N1 512. The drain terminal of the seventh NMOS transistor 522n1 is coupled to a drain terminal of the seventh PMOS transistor 522p1 to generate an output of the slave latch 540 on a slave path 525.

A source terminal of the seventh NMOS transistor 522n1 is coupled to the ground terminal and a source terminal of the eighth PMOS transistor (fourth PMOS transistor 518) is coupled to the power terminal ($V_{DD}$).

A first slave inverter 524 in the slave latch 540 is coupled to the slave half tri-state inverter 522 through the slave path 525. The slave latch 540 also includes a slave tri-state inverter 526 coupled to the first slave inverter 524.

The first slave inverter 524 includes a PMOS transistor 524p1 and an NMOS transistor 524n1. A gate terminal of the PMOS transistor 524p1 and a gate terminal of the NMOS transistor 524n1 are configured to receive the output of the slave latch 540. A source terminal of the PMOS transistor 524p1 is coupled to the power terminal ($V_{DD}$) and a source terminal of the NMOS transistor 524n1 is coupled to the ground terminal. A drain terminal of the PMOS transistor 524p1 and a drain terminal of the NMOS transistor 524n1 are coupled to generate a feedback signal.

The slave tri-state inverter 526 includes a fifth PMOS transistor 530 coupled to a fifth NMOS transistor 532. A gate terminal of the fifth PMOS transistor 530 receives the control signal (CNT) 517. A drain terminal of fifth NMOS transistor 532 is coupled to a drain terminal of the fifth PMOS transistor 530 to generate an output of the slave tri-state inverter 526 at node 'C'. A gate terminal of the fifth NMOS transistor 532 receives the clock input CLK 504.

The slave tri-state inverter 526 also includes a sixth PMOS transistor 534 and a sixth NMOS transistor 536. The sixth PMOS transistor 534 is coupled to a source terminal of the fifth PMOS transistor 530 and the sixth NMOS transistor 536 is coupled to a source terminal of the fifth NMOS transistor 532. A gate terminal of each of the sixth PMOS transistor 534 and the sixth NMOS transistor 536 receives the feedback signal from the first slave inverter 524. A source terminal of the sixth NMOS transistor 536 and a source terminal of the sixth PMOS transistor 534 are coupled to the ground terminal and the power terminal ($V_{DD}$) respectively.

A drain terminal of the fifth PMOS transistor 530 and a drain terminal of the fifth NMOS transistor 532 are coupled to the slave path 525 at node 'C'. The slave half tri-state inverter 522 is coupled to the first slave inverter 524. The output inverter 550 is coupled to an output of the slave latch 540 and generates a flip-flop output Q 552. The output inverter 550 is coupled to the slave path 525 in the slave latch 540.

The output inverter 550 includes a PMOS transistor 550*p*1 and an NMOS transistor 550*n*1. A gate terminal of the PMOS transistor 550*p*1 and a gate terminal of the NMOS transistor 550*n*1 are configured to receive the output of the slave latch 540. A source terminal of the PMOS transistor 550*p*1 is coupled to the power terminal ($V_{DD}$) and a source terminal of the NMOS transistor 550*n*1 is coupled to the ground terminal.

A drain terminal of the PMOS transistor 550*p*1 and a drain terminal of the NMOS transistor 550*n*1 are coupled to generate the flip-flop output Q 552. In one example, the master latch 520 and the slave latch 540 are configured to receive at least one of a clear signal and a preset signal. The clear signal clear the bit values stored in the master latch 520 and the slave latch 540. The preset signal sets the bit values stored in the master latch 520 and the slave latch 540 to predefined values. The operation of the flip-flop 500 is similar to the operation of the flip-flop 400 and is thus not explained here for brevity of the description.

Figure 6:
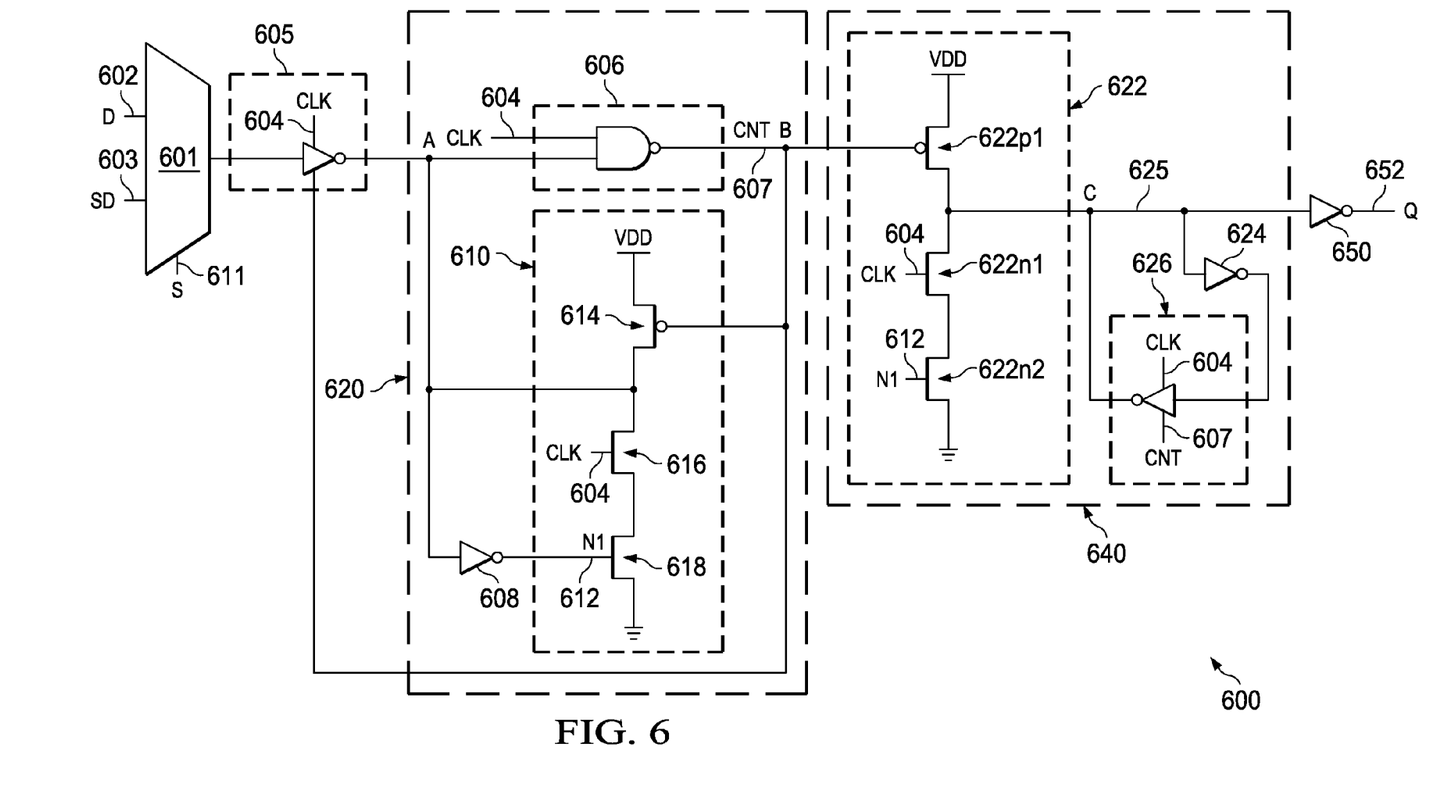
FIG. 6 illustrates a schematic of a scan flip-flop, according to an embodiment.

FIG. 6 illustrates a schematic of a scan flip-flop 600, according to an embodiment. The scan flip-flop 600 includes a multiplexer 601, a tri-state inverter 605, a master latch 620, a slave latch 640 and an output inverter 650. The multiplexer 601 receives a flip-flop input (D) 602, a scan data input (SD) 603 and a scan enable signal (S) 611. The multiplexer 601 is coupled to the tri-state inverter 605.

The tri-state inverter 605 receives an output of the multiplexer 601 and a clock input CLK 604. The master latch 620 is coupled to an output of the tri-state inverter 605. The master latch 620 includes a node 'A' that receives the output of the tri-state inverter 605. The node 'A' is coupled to an inverting logic gate 606. The inverting logic gate 606 receives the output of the tri-state inverter 605 and the clock input CLK 604.

An output of the inverting logic gate 606 is an output of the master latch 620. A node 'B' receives an output of the master latch 620. The master latch 620 includes a master inverter 608 coupled to the node 'A' and receives the output of the tri-state inverter 605. The master inverter 608 generates a first inverted output N1 612. The master latch 620 includes a master half tri-state inverter 610.

The master half tri-state inverter 610 includes a third PMOS transistor 614. A gate terminal of the third PMOS transistor 614 is coupled to the node 'B'. A third NMOS transistor 616 is coupled to a drain terminal of the third PMOS transistor 614. A gate terminal of the third NMOS transistor 616 receives the clock input CLK 604. A fourth NMOS transistor 618 is coupled to a source terminal of the third NMOS transistor 616. A gate terminal of the fourth NMOS transistor 618 is coupled to the master inverter 608 and receives the first inverted output N1 612.

The source terminal of the fourth NMOS transistor 618 and a source terminal of the third PMOS transistor 614 are coupled to a ground terminal and a power terminal ($V_{DD}$) respectively. The slave latch 640 receives the output of the master latch 620. The slave latch 640 is coupled to node 'B'. The slave latch 640 includes a slave half tri-state inverter 622 that receives the output of the master latch 620. The slave half tri-state inverter 622 generates an output of the slave latch 640 on a slave path 625. A first slave inverter 624 in the slave latch 640 is coupled to the slave half tri-state inverter 622 through the slave path 625. The slave latch 640 also includes a slave tri-state inverter 626 coupled to the first slave inverter 624. An output of the slave tri-state inverter 626 is coupled to a node 'C' on the slave path 625.

The slave half tri-state inverter 622 includes a seventh PMOS transistor 622*p*1. A gate terminal of the seventh PMOS transistor 622*p*1 receives the output of the master latch 620. A seventh NMOS transistor 622*n*1 is coupled to a drain terminal of the seventh PMOS transistor 622*p*1. A gate terminal of the seventh NMOS transistor 622*n*1 receives the clock input CLK 604. An eighth NMOS transistor 622*n*2 is coupled to a source terminal of the seventh NMOS transistor 622*n*1. A gate terminal of the eighth NMOS transistor 622*n*2 receives the first inverted output N1 612. The drain terminal of the seventh PMOS transistor 622*p*1 is coupled to a drain terminal of the seventh NMOS transistor 622*n*1 to generate the output of the slave latch 640 on the slave path 625.

The output inverter 650 is coupled to the output of the slave latch 640 and generates a flip-flop output Q 652. The output inverter 650 is coupled to the slave path 625 in the slave latch 640. In one example, the master latch 620 and the slave latch 640 are configured to receive at least one of a clear signal and a preset signal. The clear signal clear the bit values stored in the master latch 620 and the slave latch 640. The preset signal sets the bit values stored in the master latch 620 and the slave latch 640 to predefined values. The scan flip-flop 600 may include one or more additional components or inputs known to those skilled in the relevant art and are not discussed here for simplicity of the description.

The operation of the scan flip-flop 600 illustrated in FIG. 6 is explained now. The multiplexer 601 selects one of the flip-flop input (D) 602 and the scan data input (SD) 603 based on the scan enable signal (S) 611. The multiplexer 601 provides one of the flip-flop input (D) 602 and the scan data input (SD) 603 to the tri-state inverter 605. The processing of one of the flip-flop input (D) 602 and the scan data input (SD) 603 in the tri-state inverter 605, the master latch 620, the slave latch 640 and the output inverter 650 is similar to the processing of the flip-flop input (D) 202 in the flip-flop 200 as explained in connection with FIG. 2.

Therefore, the complete operation of the scan flip-flop 600 is not discussed here for simplicity of the description. It is noted that the scan flip-flop 600 can be a positive edge triggered flip-flop or a negative edge triggered flip-flop. The embodiments discussed in connection with FIG. 2 to FIG. 4 are applicable to the scan flip-flop 600 and variations, and alternative constructions are apparent and well within the spirit and scope of the disclosure.

Figure 7:
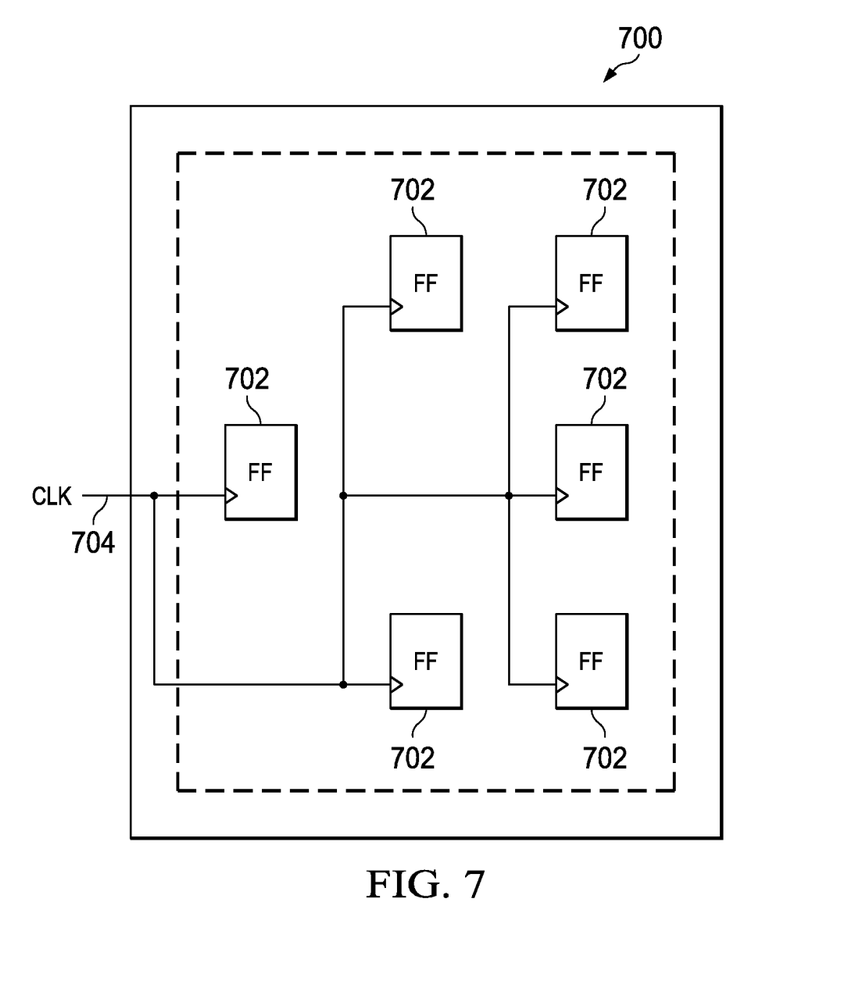
FIG. 7 illustrates schematic of an apparatus, according to the embodiment.

FIG. 7 illustrates schematic of an apparatus 700, according to the embodiment. The apparatus 700 includes a clock input 704 and a plurality of flip-flops. Each flip-flop 702 of the plurality of flip-flops is configured to receive the clock input 704. Each flip-flop 702 of the plurality of flip-flops is analogous to at least one of the flip-flop 200, flip-flop 300, flip-flop 400, flip-flop 500 and scan flip-flop 600, in both connections and operations and thereby not repeated for the sake of simplicity.

The apparatus 700 includes the large numbers of flip-flop 702, hence with reduced transistor switching; the power consumed by the apparatus 700 can be significantly reduced. By eliminating an inverter to invert the clock input 704, the apparatus 700 is able to reduce the inverter short-circuit power loss. Further the number of transistors that receive a constantly toggling signal is reduced from 10 transistors in flip-flop 100 to 6 transistors; thus eliminating the associated gate capacitances. Hence, with the reduction in the number of clock related transistors, clock power consumption and inverter short-circuit power loss, in each of the plurality of flip-flops; a considerable amount of power is saved in the apparatus 700.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A flip-flop comprising:
    a tri-state inverter configured to receive a flip-flop input and a clock input;
    a master latch coupled to an output of the tri-state inverter and configured to provide a control signal to the tri-state inverter, the control signal configured to activate the tri-state inverter;
    a slave latch configured to receive an output of the master latch and the control signal; and
    an output inverter coupled to an output of the slave latch and configured to generate a flip-flop output.

2. The flip-flop of claim 1 is at least a positive edge triggered flip-flop and a negative edge triggered flip-flop.

3. The flip-flop of claim 2, wherein when the clock input is at logic '0' in the positive edge triggered flip-flop, the control signal activates the tri-state inverter such that the output of the tri-state inverter is inverse of the flip-flop input.

4. The flip-flop of claim 2, wherein when the clock input is at logic '1' in the negative edge triggered flip-flop, the control signal activates the tri-state inverter such that the output of the tri-state inverter is inverse of the flip-flop input.

5. The flip-flop of claim 1, wherein the tri-state inverter comprises:
    a first PMOS transistor and a first NMOS transistor, a gate terminal of the first PMOS transistor and a gate terminal of the first NMOS transistor configured to receive the flip-flop input;
    a second PMOS transistor coupled to a drain terminal of the first PMOS transistor; and
    a second NMOS transistor coupled to a drain terminal of the first NMOS transistor, wherein a drain terminal of the second PMOS transistor is coupled to a drain terminal of the second NMOS transistor to generate the output of the tri-state inverter.

6. The flip-flop of claim 5, wherein when the flip-flop is a positive edge triggered flip-flop, a gate terminal of the second PMOS transistor is configured to receive the clock input and a gate terminal of the second NMOS transistor is configured to receive the control signal.

7. The flip-flop of claim 5, wherein when the flip-flop is a negative edge triggered flip-flop, the gate terminal of the second PMOS transistor is configured to receive the control signal and the gate terminal of the second NMOS transistor is configured to receive the clock input.

8. The flip-flop of claim 1, wherein the master latch comprises:
    an inverting logic gate configured to receive the clock input and the output of the tri-state inverter and configured to generate the control signal, the control signal is the output of the master latch;
    a master inverter configured to receive the output of the tri-state inverter and configured to generate a first inverted output; and
    a master half tri-state inverter configured to receive the control signal, the clock input and the first inverted output.

9. The flip-flop of claim 8, wherein the inverting logic gate is a NAND gate when the flip-flop is a positive edge triggered flip-flop, and the inverting logic gate is a NOR gate when the flip-flop is a negative edge triggered flip-flop.

10. The flip-flop of claim 8, wherein when the flip-flop is a positive edge triggered flip-flop, the master half tri-state inverter comprises:
    a third PMOS transistor, a gate terminal of the third PMOS transistor configured to receive the control signal;
    a third NMOS transistor coupled to a drain terminal of the third PMOS transistor, a gate terminal of the third NMOS transistor configured to receive the clock input; and
    a fourth NMOS transistor coupled to a source terminal of the third NMOS transistor, a gate terminal of the fourth NMOS transistor configured to receive the first inverted output.

11. The flip-flop of claim 8, wherein when the flip-flop is a negative edge triggered flip-flop, the master half tri-state inverter comprises:
    a third NMOS transistor, a gate terminal of the third NMOS transistor configured to receive the control signal;
    a fourth PMOS transistor coupled to a drain terminal of the third NMOS transistor, a gate terminal of the fourth PMOS transistor configured to receive the clock input; and a third PMOS transistor coupled to a source terminal of the fourth PMOS transistor, a gate terminal of the third PMOS transistor configured to receive the first inverted output.

12. The flip-flop of claim 1, wherein the slave latch comprises:
a slave half tri-state inverter configured to receive the output of the master latch, the clock input and the first inverted output, the slave half tri-state inverter configured to generate the output of the slave latch on a slave path;
a first slave inverter coupled to the slave path and configured to receive the output of the slave latch from the slave half tri-state inverter, the first slave inverter configured to generate a feedback signal; and
a slave tri-state inverter coupled to the first slave inverter and configured to receive the feedback signal, the clock input and the control signal.

13. The flip-flop of claim 12, wherein when the flip-flop is a positive edge triggered flip-flop, the slave tri-state inverter comprises:
a fifth PMOS transistor, a gate terminal of the fifth PMOS transistor configured to receive the clock input;
a fifth NMOS transistor coupled to a drain terminal of the fifth PMOS transistor, a gate terminal of the fifth NMOS transistor configured to receive the control signal;
a sixth PMOS transistor coupled to a source terminal of the fifth PMOS transistor, a gate terminal of the sixth PMOS transistor configured to receive the feedback signal; and
a sixth NMOS transistor coupled to a source terminal of the fifth NMOS transistor, a gate terminal of the sixth NMOS transistor configured to receive the feedback signal.

14. The flip-flop of claim 12, wherein when the flip-flop is a negative edge triggered flip-flop, the slave tri-state inverter comprises:
a fifth PMOS transistor, a gate terminal of the fifth PMOS transistor configured to receive the control signal;
a fifth NMOS transistor coupled to a drain terminal of the fifth PMOS transistor, a gate terminal of the fifth NMOS transistor configured to receive the clock input;
a sixth PMOS transistor coupled to a source terminal of the fifth PMOS transistor, a gate terminal of the sixth PMOS transistor configured to receive the feedback signal; and
a sixth NMOS transistor coupled to a source terminal of the fifth NMOS transistor, a gate terminal of the sixth NMOS transistor configured to receive the feedback signal.

15. The flip-flop of claim 12, wherein when the flip-flop is a positive edge triggered flip-flop, the slave half tri-state inverter comprises:
a seventh PMOS transistor, a gate terminal of the seventh PMOS transistor configured to receive the output of the master latch;
a seventh NMOS transistor coupled to a drain terminal of the seventh PMOS transistor, a gate terminal of the seventh NMOS transistor configured to receive the clock input; and
an eighth NMOS transistor coupled to a source terminal of the seventh NMOS transistor, a gate terminal of the eighth NMOS transistor configured to receive the first inverted output.

16. The flip-flop of claim 12, wherein when the flip-flop is a negative edge triggered flip-flop, the slave half tri-state inverter comprises:

a seventh NMOS transistor, a gate terminal of the seventh NMOS transistor configured to receive the output of the master latch;
a seventh PMOS transistor coupled to a drain terminal of the seventh NMOS transistor, a gate terminal of the seventh PMOS transistor configured to receive the clock input; and
an eighth PMOS transistor coupled to a source terminal of the seventh PMOS transistor, a gate terminal of the eighth PMOS transistor configured to receive the first inverted output.

17. The flip-flop of claim 1, wherein the output inverter is configured to invert the output of the slave latch to generate the flip-flop output.

18. The flip-flop of claim 1, wherein in steady state, the flip-flop output is equal to the flip-flop input.

19. The flip-flop of claim 1, wherein the master latch and the slave latch are configured to receive at least one of a clear signal and a preset signal.

20. The flip-flop of claim 1 further comprising a multiplexer coupled to the tri-state inverter, the multiplexer configured to receive the flip-flop input and a scan data input.

21. The flip-flop of claim 20, wherein the multiplexer is configured to receive a scan enable to select one of the flip-flop input and the scan data input, and the multiplexer is configured to provide one of the flip-flop input and the scan data input to the tri-state inverter.

22. An apparatus comprising:
a clock input;
a plurality of flip-flops configured to receive the clock input, wherein each of the flip-flop comprises:
a tri-state inverter configured to receive a flip-flop input and the clock input;
a master latch coupled to an output of the tri-state inverter and configured to provide a control signal to the tri-state inverter, the control signal configured to activate the tri-state inverter;
a slave latch configured to receive an output of the master latch and the control signal; and
an output inverter coupled to an output of the slave latch and configured to generate a flip-flop output.

23. A flip-flop comprising:
a tri-state inverter configured to receive a flip-flop input and a clock input;
a master latch coupled to an output of the tri-state inverter, the master latch comprising at least one inverting logic gate generating a control signal, the control signal configured to activate the tri-state inverter;
a slave latch configured to receive an output of the master latch and the control signal; and
an output inverter coupled to an output of the slave latch and configured to generate a flip-flop output.

24. The flip-flop of claim 23, wherein the inverting logic gate in the master latch is at least one of a NAND gate and a NOR gate, and the inverting logic gate is configured to invert at least one of the clock signal and the output of the tri-state inverter.

25. A flip-flop comprising:
a tri-state inverter configured to receive a flip-flop input and a clock input;
a master latch coupled to an output of the tri-state inverter and configured to provide a control signal to the tri-state inverter, the control signal configured to activate the tri-state inverter;
a slave latch configured to receive an output of the master latch and the control signal; and an output inverter coupled to an output of the slave latch and configured to generate a flip-flop output; wherein the tri-state inverter comprises:
a first PMOS transistor and a first NMOS transistor, a gate terminal of the first PMOS transistor and a gate terminal of the first NMOS transistor configured to receive the flip-flop input;
a second PMOS transistor coupled to a drain terminal of the first PMOS transistor; and
a second NMOS transistor coupled to a drain terminal of the first NMOS transistor, wherein a drain terminal of the second PMOS transistor is coupled to a drain terminal of the second NMOS transistor to generate the output of the tri-state inverter, wherein when the flip-flop is a positive edge triggered flip-flop, a gate terminal of the second PMOS transistor is configured to receive the clock input and a gate terminal of the second NMOS transistor is configured to receive the control signal.

26. The flip-flop of claim 25 is at least a positive edge triggered flip-flop and a negative edge triggered flip-flop and wherein when:
the clock input is at logic '0' in the positive edge triggered flip-flop, the control signal activates the tri-state inverter such that the output of the tri-state inverter is inverse of the flip-flop input;
the clock input is at logic '1' in the negative edge triggered flip-flop, the control signal activates the tri-state inverter such that the output of the tri-state inverter is inverse of the flip-flop input; and
the flip-flop is a negative edge triggered flip-flop, the gate terminal of the second PMOS transistor is configured to receive the control signal and the gate terminal of the second NMOS transistor is configured to receive the clock input.

27. The flip-flop of claim 25, wherein the master latch comprises:
an inverting logic gate configured to receive the clock input and the output of the tri-state inverter and configured to generate the control signal, the control signal is the output of the master latch;
a master inverter configured to receive the output of the tri-state inverter and configured to generate a first inverted output; and
a master half tri-state inverter configured to receive the control signal, the clock input and the first inverted output.

28. The flip-flop of claim 25, wherein:
when the flip-flop is a positive edge triggered flip-flop, the master half tri-state inverter comprises:
a third PMOS transistor, a gate terminal of the third PMOS transistor configured to receive the control signal;
a third NMOS transistor coupled to a drain terminal of the third PMOS transistor, a gate terminal of the third NMOS transistor configured to receive the clock input; and
a fourth NMOS transistor coupled to a source terminal of the third NMOS transistor, a gate terminal of the fourth NMOS transistor configured to receive the first inverted output; and
when the flip-flop is a negative edge triggered flip-flop, the master half tri-state inverter comprises:
a third NMOS transistor, a gate terminal of the third NMOS transistor configured to receive the control signal;
a fourth PMOS transistor coupled to a drain terminal of the third NMOS transistor, a gate terminal of the fourth PMOS transistor configured to receive the clock input; and
a third PMOS transistor coupled to a source terminal of the fourth PMOS transistor, a gate terminal of the third PMOS transistor configured to receive the first inverted output.

29. The flip-flop of claim 25, wherein the slave latch comprises:
a slave half tri-state inverter configured to receive the output of the master latch, the clock input and the first inverted output, the slave half tri-state inverter configured to generate the output of the slave latch on a slave path;
a first slave inverter coupled to the slave path and configured to receive the output of the slave latch from the slave half tri-state inverter, the first slave inverter configured to generate a feedback signal; and
a slave tri-state inverter coupled to the first slave inverter and configured to receive the feedback signal, the clock input and the control signal.

* * * * *